(12) United States Patent
Fukakusa et al.

(10) Patent No.: US 11,652,024 B2
(45) Date of Patent: May 16, 2023

(54) COOLER

(71) Applicant: Mitsubishi Electric Corporation, Tokyo (JP)

(72) Inventors: Noriyuki Fukakusa, Tokyo (JP); Masahiro Noguchi, Tokyo (JP); Takashi Omura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 290 days.

(21) Appl. No.: 16/752,827

(22) Filed: Jan. 27, 2020

(65) Prior Publication Data
US 2020/0335424 A1    Oct. 22, 2020

(30) Foreign Application Priority Data
Apr. 22, 2019 (JP) .............................. JP2019-080716

(51) Int. Cl.
| H05K 7/20 | (2006.01) |
| H01L 23/473 | (2006.01) |
| H01L 23/40 | (2006.01) |

(52) U.S. Cl.
CPC ........ H01L 23/473 (2013.01); H01L 23/4006 (2013.01); H05K 7/20872 (2013.01);
(Continued)

(58) Field of Classification Search
CPC ....................... H05K 7/20872; H05K 7/20927
See application file for complete search history.

(56) References Cited

U.S. PATENT DOCUMENTS 6,935,412 B2 * 8/2005 Mueller ................ H01L 23/473
                                                           174/15.1
2001/0014029 A1 8/2001 Suzuki et al.
(Continued)

FOREIGN PATENT DOCUMENTS

CN       205298167 U    6/2016
JP     2001-308246 A   11/2001
(Continued)

OTHER PUBLICATIONS

Communication dated Sep. 16, 2022 from the Chinese Patent Office in Chinese Application No. 202010294251.0.

*Primary Examiner* — David J Teitelbaum
(74) *Attorney, Agent, or Firm* — Sughrue Mion, PLLC; Richard C. Turner

(57) ABSTRACT

A cooler includes a base on the upper surface of which semiconductor elements are mounted; a housing which is superimposed on the rear surface side of the base and between which and the base a refrigerant flow path is formed; screws which are disposed in the outer peripheral portion of an overlap region between the base and the housing and which fasten and fix the base to the housing; O-rings which seal the outer peripheral portion of the refrigerant flow path; and joining members which are disposed in a joining surface portion of the housing, which is inside the outer peripheral portion of the refrigerant flow path and makes contact with the base, and which bite into the base and housing in an unpenetrated state. The joining strength between the housing and the base is reinforced by the joining members whose joint interfaces are not exposed to the outside.

8 Claims, 5 Drawing Sheets

(52) U.S. Cl.
CPC .. *H05K 7/20927* (2013.01); *H01L 2023/4081* (2013.01); *H01L 2023/4087* (2013.01)

(56) References Cited

U.S. PATENT DOCUMENTS

| | | | | |
|---|---|---|---|---|
| 2003/0175095 A1* | 9/2003 | Clarke | .................. | B21J 15/025 |
| | | | | 411/501 |
| 2004/0148760 A1* | 8/2004 | Wang | ................ | B23K 11/0066 |
| | | | | 29/525.06 |
| 2011/0100585 A1* | 5/2011 | Hohenstein | ........... | H01L 23/473 |
| | | | | 165/41 |
| 2017/0055378 A1* | 2/2017 | Zhou | ................ | H05K 7/20927 |

FOREIGN PATENT DOCUMENTS

| | | |
|---|---|---|
| JP | 2007-036214 A | 2/2007 |
| JP | 2012-105370 A | 5/2012 |

\* cited by examiner

COOLER

BACKGROUND OF THE INVENTION

Field of the Invention

The present application relates to the field of a cooler.

Description of the Related Art

An electric motor is used as a power source in a vehicle. When the electric motor is to be driven by alternating current, a power conversion device including inverters, converters, and the like, is mounted on the vehicle in order to convert direct current of a battery or the like to alternating current. The power conversion device has a configuration wherein semiconductor elements are provided in a power conversion circuit, and the semiconductor elements generate heat along with power conversion, thus requiring a cooler for cooling the semiconductor elements.

As the cooler, for example, a configuration is disclosed wherein semiconductor elements are mounted on the upper surface of a heatsink with cooling fins, and a casing is joined to the rear surface side of the heatsink from which the fins protrude, thereby providing a cooling channel (for example, refer to PTL 1).

Also, a configuration is disclosed wherein, in order to reduce the thickness of a plate member on the upper surface of which to mount a power module, and to suppress a deformation of the plate member, a guide rib is provided on a housing side in contact with the rear surface of the plate member, and bolt fastening portions of the power module are provided above the guide rib (for example, refer to PTL 2).

Furthermore, a configuration is disclosed wherein double O-rings are provided in a portion which configures a watertight portion between a heat dissipation substrate and a heatsink, and liquid discharge holes which allow leaking water to escape are provided between the outside and inside O-rings (for example, refer to PTL 3).

[PTL 1] JP-A-2007-36214
[PTL 2] JP-A-2012-105370
[PTL 3] JP-A-2001-308246

In order to secure the cooler's mechanical strength adapted to an in-vehicle environment, in which an external force, such as vibration or impact, acts, a fixing portion in which to fix a base to a housing is required to be disposed not only in the outer peripheral portion of an overlap region between the base and the housing, but also in the central portion of the overlap region. In order to dispose fastening members for normal screw fastening in the central portion of the overlap region between the base and the housing, however, a space required for sealing, in which to dispose fastening screws and sealing members, such as double sealing O-rings, is required, and a refrigerant flow path has to be reduced by that amount, so that there is a case in which it is difficult to strike a balance between an improvement in mechanical strength and a securement of cooling performance.

SUMMARY OF THE INVENTION

The present application has been made to solve the problem, and an object of the present application is to obtain a cooler which can improve mechanical strength and secure cooling performance.

The cooler disclosed in the present application includes a base on the upper surface of which semiconductor elements are mounted; a housing which is superimposed on the rear surface side of the base and between which and the base a refrigerant flow path is formed; fastening members which are disposed in the outer peripheral portion of an overlap region between the base and the housing and which fasten and fix the base to the housing; sealing members which seal the outer peripheral portion of the refrigerant flow path; and joining members which are disposed in a joining surface portion of the housing, which is inside the outer peripheral portion of the refrigerant flow path and makes contact, with the base, and which bite into the base and housing in an unpenetrated state.

According to the cooler of the present application, the joining members are disposed inside the outer peripheral portion of the refrigerant flow path, and the base and the housing can be joined together by causing the joining members to bite into the base and housing in an unpenetrated state. The cooler disclosed in the present application enables an improvement in mechanical strength, while it does not happen that a refrigerant leaks even when the refrigerant contacts the respective surfaces of the joining members, and requires no apace for sealing the joining members is required, thus enabling a securement of cooling performance.

DETAILED DESCRIPTION OF THE PREFERRED EMBODIMENTS

First Embodiment

A description will be given, using FIGS. 1 to 5, of a cooler 1 according to the first embodiment of the present application. The cooler 1, being of a configuration suitable for an in-vehicle power conversion device 100, has mechanical strength, which can withstand damage due to vibration or the like, and cooling performance capable of high output, power. It goes without saying, however, that the power conversion device 100 can also be used far any other purpose than for in-vehicle use.

Figure 1:
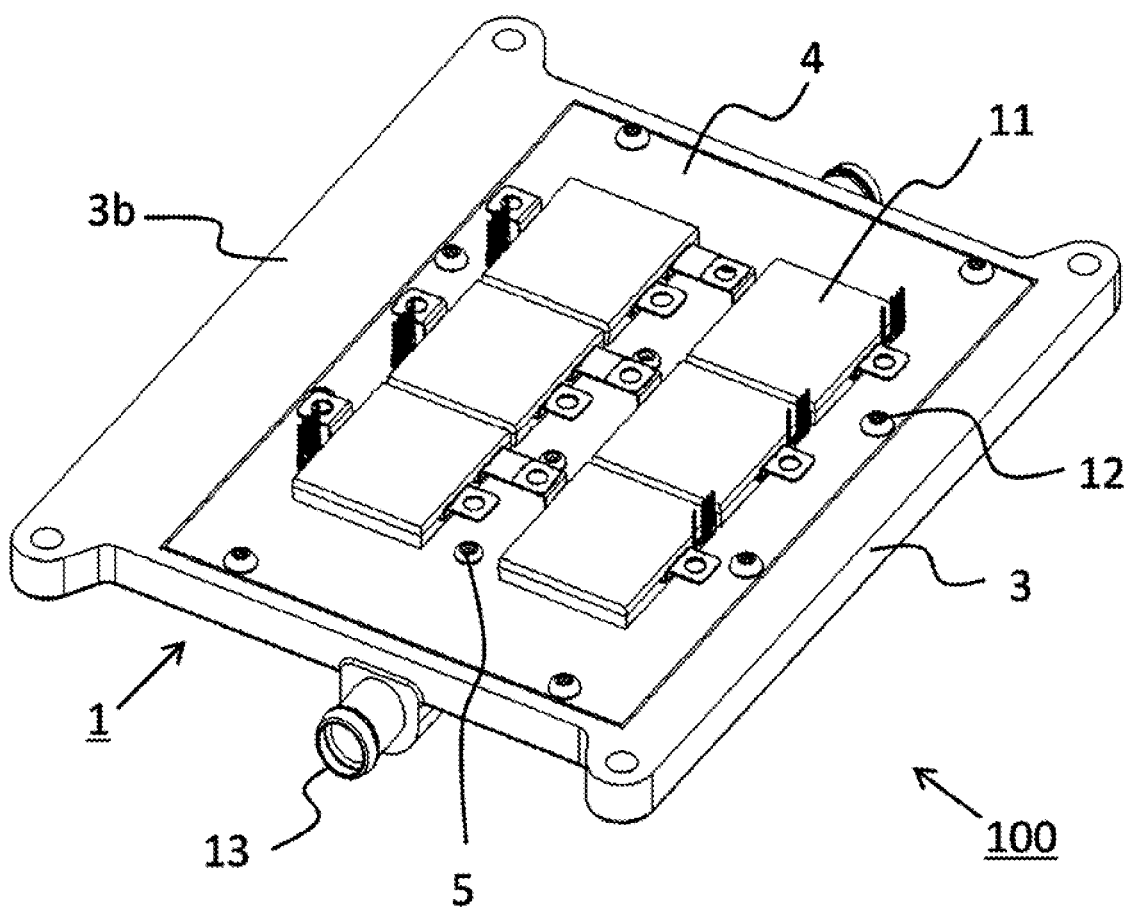
FIG. 1 is a perspective view of a power conversion device including a cooler according to the first embodiment.
Figure 2:
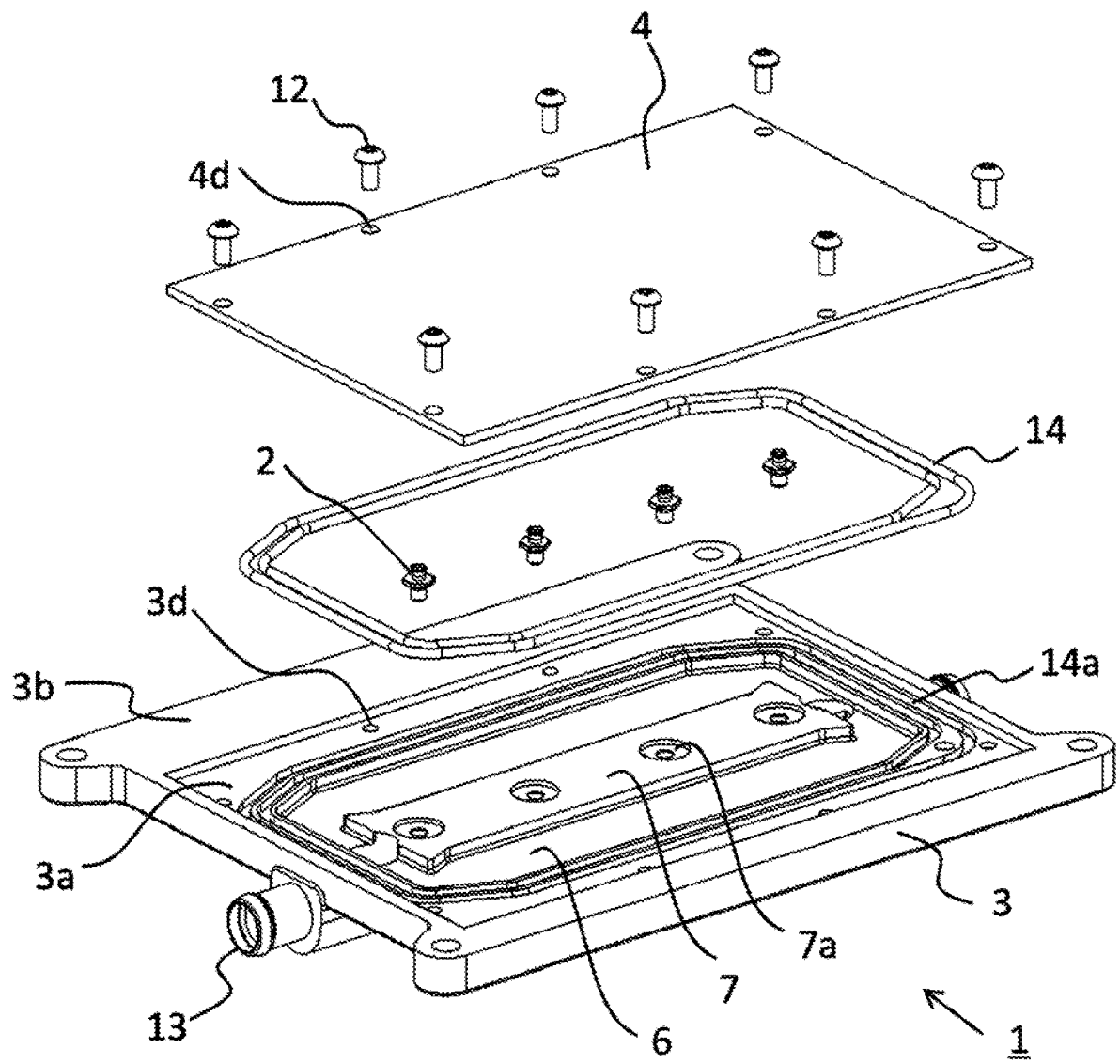
FIG. 2 is an exploded perspective view of the cooler.
Figure 3:
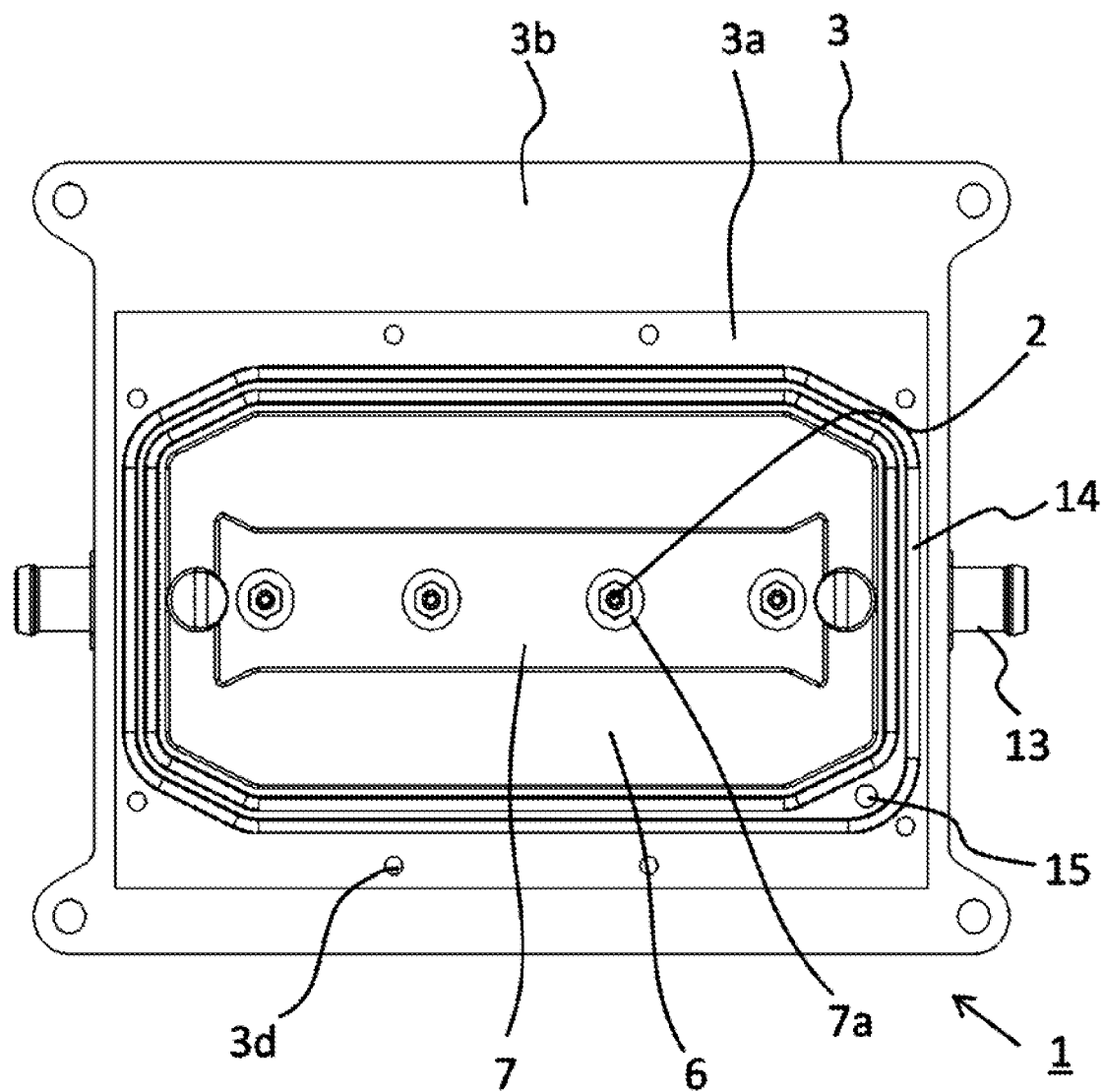
FIG. 3 is a plan view of a housing.
Figure 4:
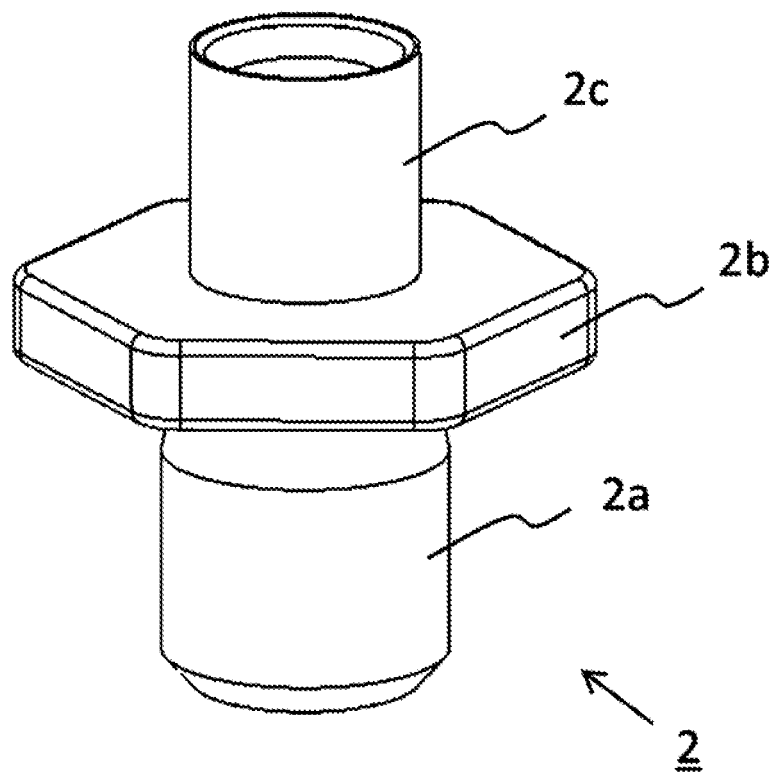
FIG. 4 is an enlarged perspective view of a joining member.
Figure 5:
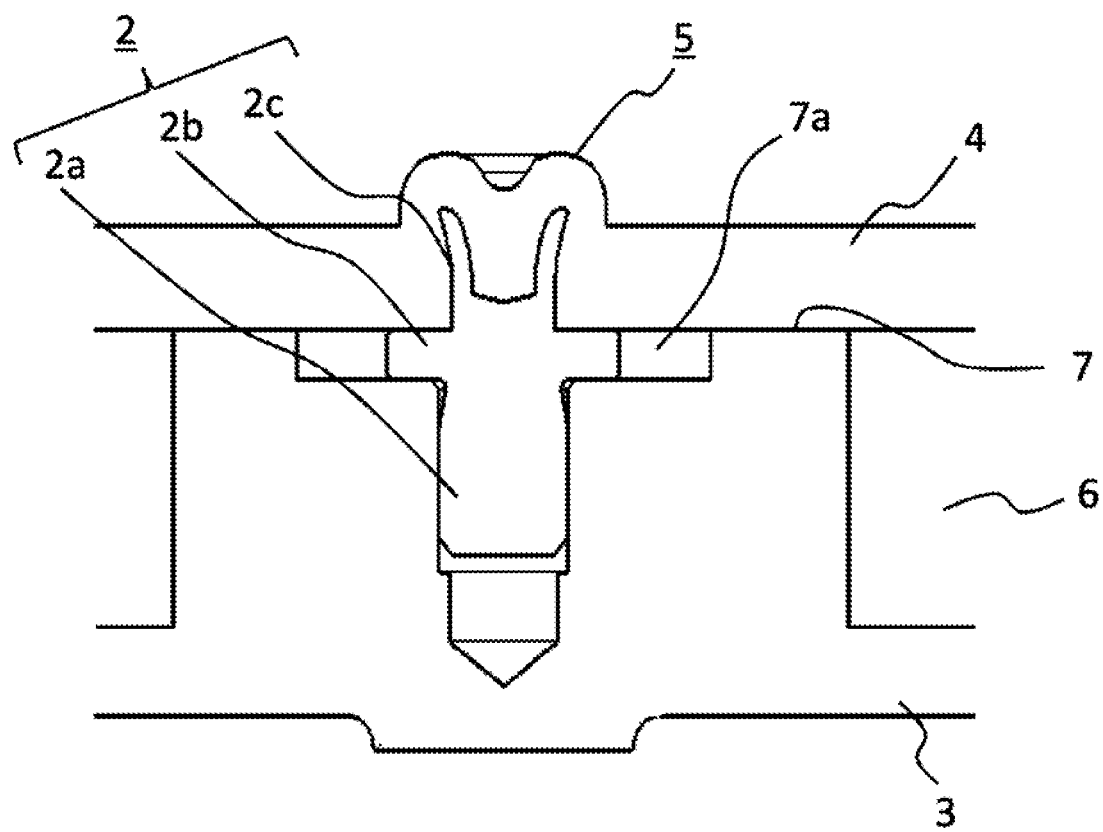
FIG. 5 is a sectional view showing a state in which a base and the housing are joined together by the joining member.

FIG. 1 is a perspective view of the power conversion device 200 which includes the cooler 1 according to the first, embodiment, FIG. 2 is an exploded perspective view of the cooler 1 in FIG. 1, FIG. 3 is a plan view of a housing 3 at a stage before a base 4 is super imposed thereon, FIG. 4 is an enlarged perspective view of a joining member 2, and FIG. 5 is a sectional view showing a state in which the base 4 and the housing 3 are joined together by the joining member 2.

As shown in FIGS. 1 to 3, semiconductor elements 11, which are electronic parts constituting the power conversion device 100, are mounted on the upper surface of the base 4, and the housing 3 is superimposed on the rear surface side of the base 4. The joining members 2 which are featured component portions of the present application are rot exposed on the upper surface of the base 4, but it can be confirmed, by bumps rising on an upper surface portion of the base 4, that joint portions 5 which reinforce the strength of anchorage of the base 4 to the housing 3 are positioned in the central portion of the base 4. The joint portions 5 refer to component portions in which the joining members 2 are caused to bite into both the housing 3 and the base 4, anchoring then together.

As shown in FIGS. 2 and 3, a refrigerant flow path 6 is formed between the housing 3 and the base 4, and a refrigerant is led in and discharged via a piping portion 13. Screws 12 or the like (fastening members) are disposed in the outer peripheral portion of an overlap region between the base 4 and the housing 3, fastening and fixing the base 4 to the housing 3. Here, screw holes 3d through which to fasten and fix the base 4 to the housing 3 with the screws 12 are provided in the outer peripheral portion of a housing upper surface portion 3a on which to place the base 4, and hole portions 4d passing through the base 4 in its thickness direction are opened in corresponding portions on the base 4 side.

Also, in the housing upper surface portion 3a, O-rings 14 (sealing members) for causing the refrigerant flow path 6 to serve as a watertight portion are fitted in respective O-ring disposition grooves 14a, inside the screws 12, sealing the outer peripheral portion of the refrigerant flow path 6. The refrigerant flow path 6 formed of a groove portion of a form in which the housing upper surface portion 3a is dug down is provided inside the O-ring disposition grooves 14a, and opening portions 7a in which to bury the joining members 2 are opened in a joining surface portion 7 surrounded by the refrigerant flow path 6.

The joining surface portion 7 raised up to the height of the housing upper surface portion 3a on which to place the base 4 is provided inside the outer peripheral portion of the refrigerant flow path 6, that is, inside the O-rings 14, the joining members 2 which are called, for example, rivets are set in the joining surface portion 7, the base 4 is placed thereon, and pressure is applied to the housing 3 side, thereby causing the joining members 2 to bite into the insides of the base 4 and housing 3, thus joining both of them together. At this time, the joining members 2 fall into a state of being buried in the housing 3 and base 4, but do not become exposed on the outside surface portions of the housing 3 and base 4, so that it does not happen that the watertight portion of the refrigerant flow path 6 is broken.

As heretofore described, the joining members 2 with which to join and fix the base 4 to the housing 3 are disposed in positions by fitting the respective lower end sides of the joining members 2 into the corresponding opening portions 7a of the joining surface portion 7, surrounded by the refrigerant flow path 6, inside the housing upper surface portion 3a to which to join the rear surface of the base 4. For example, the groove portion is formed around the joining surface portion 7 so that the joining surface portion 7 is left behind in the central portion (the center in the plan view of FIG. 3) of the refrigerant flow path 6, and thereby the joining surface portion 7 can be formed into an island raised up to the height of the housing upper surface portion 3a from the bottom surface portion of the refrigerant flow path 6. FIGS. 2 and 3 exemplify a configuration in which the joining surface portion 7 is formed elongated along the flow of the refrigerant and the plurality of joining members 2 are disposes spaced apart in one direction.

Also, the example of FIG. 1 shows a case in which the upper surface of the base 4 is flush with the upper surface of a housing edge portion 3b of the outer peripheral portion of the housing 3. Because of this, the housing edge portion 3b is in a state of rising by the amount corresponding to the thickness of the base 4 above the housing upper surface portion 3a on which to place the base 4. When this kind of housing edge portion 3b is provided, it is easy to position the base 4 in and with respect to the housing 3.

Although omitted from the description in FIG. 1, electrical parts, such as capacitors and control beards, terminal blocks which connect the capacitors and semiconductor elements 11, and the like, are mounted on the cooler 1.

Next, a description will be given, using FIG. 4, of the shape of the joining member 2 at a stage before the joining member 2 is press fitted between the housing 3 and the base 4. The joining member 2 with which to carry out mechanical joining in the cooler 1 is such that one end (on the lower end side) thereof is a screw fastening portion 2a to be screwed into the joining surface portion 7 of the housing 3, and that the screw fastening portion 2c is helically threaded on its cuter peripheral portion.

Also, a plate-like engaging portion 2b to engage with a screw fastening jig is provided in the central portion of the joining member 2. The outer peripheral shape of the engaging portion 2b is processed into, for example, a hexagonal shape in order to cause the screw fastening portion 2a to rotate and be screw fastened to the housing 3, and the upper surface of the engaging portion 2b is flush with the housing upper surface portion 3a in the state in which the screw fastening portion 2a is buried in the housing 3.

A cylindrical portion 2c to be caused to bite into the base 4 is formed at the other end (on the upper end side) of the joining member 2. The cylindrical portion 2c protrudes upward from the housing upper surface portion 3a in the state in which the joining member 2 is fixed in the housing 3, and is formed so that the opening portion in the cylinder is largest in diameter at the leading end portion.

Also, the cylindrical portion 2c of the joining member 2 is provided so that the leading end portion of the cylindrical portion 2c is smaller in thickness than the root portion thereof. Because of this, the base 4 is pressed against the cylindrical portion 2c, thereby obtaining the state in which the cylindrical portion 2c to be buried into the inside of the base 4 is outwardly pressed and expanded so that the diameter of the leading end portion increases gradually, and bites into the base 4, and the leading end of the cylindrical portion 2c is expanded into a wedge shape, thus serving as a retainer.

As FIG. 5 shows the joint portion 5 in which the base 4 and the housing 3 are joined together by the joining member 2, the cylindrical portion 2c of the joining member 2 does not protrude from the surface portion of the base 4, and the screw fastening portion 2a of the joining member 2 and the housing 3 are fixed, while the cylindrical portion 2c of the joining member 2 and the base 4 are fixed, so that it is possible to reinforce the mechanical strength of the cooler 1. It is thereby possible to mitigate the negative effect of a decrease in rigidity associated with a reduction in the thickness of the base 4 for the purpose of an improvement in cooling performance. Also, the joining members 2 are disposed in the central portion of the refrigerant flow path 6, and thereby it is possible to efficiently improve the mechanical strength with a smaller number of joints than when disposing the joining members 2 in a region close to the outer peripheral portion of the refrigerant flow path 6.

Also, as shown in FIG. 5, in the configuration in which the joining member 2 is press fitted between the housing 3 and the base 4 in order to reinforce the mechanical strength of the cooler 1, the joint interface between the joining member 2 and the housing 3 or the base 4 has not reached the outside of the cooler 1, and even when cooling water infiltrates into the surface portion of the joining member 2, it does not happen that there occurs a water leakage passing through the joint interface between the joining member 2 and the housing 3 or the base 4 which is formed by press fitting the joining member 2. Therefore, sealing using the O-rings 14 or the like is not necessary for the joining members 2, so that it does not happen that the space in which to form the refrigerant flow path 6 is reduced, and it is thus possible to secure the cooling performance.

Meanwhile, the joining of the outer peripheral portion of the base 4 to the housing 2 is carried out by mechanical fastening using the double O-ring a 14 and screws 12, as shown in FIG. 2, and when cooling water leaks from the refrigerant flow path 6, the cooling water is discharged from a discharge hole 15 provided between the double O-rings 14 to the outside of the power conversion device 100, as shown in FIG. 3. Therefore, it does not happen that high power parts are short-circuited.

In order to connect the cuter peripheral portion of the base 4 to the housing 3, it is possible to apply thereto mechanical joining by using, for example, a combination of a waterproof structure and screw fastening utilizing FIPG (Formed-In-Place Gasket), metal gasket, or the like, or diffusion joining or welding, such as FSW (Friction Stir Welding) or laser beam joining.

Also, as a countermeasure for the water leakage passing through the joint interface between the housing 3 and the base 4, it is effective to take measures to, for example, expand the base 4 so as for the joint interface not to reach the inside of the power conversion device 100.

Here, the base 4 on which to mount the semiconductor elements 11 is formed of an aluminum extruded material which is high in thermal conductivity and has a small, number of internal deletions, such as cavities, generated when manufactured, and the housing 3 in which to form the refrigerant flow path 6 is formed by aluminum casting high in productivity. It is thereby possible, utilizing a high elongatablity which is a property on the aluminum extruded material side of the base 4, to press fit the joining members 2 into the base 4 without the joint interfaces doing exposed to the outside. Then, at the same time, while securing the productivity of the housing 3, it is possible, by screw fastening the screw fastening portions 2a to the aluminum casting side, to suppress crack generation, or the like, caused by press fitting the screw fastening portions 2a.

It goes without saying that stress generated in the joint interfaces can be reduced by configuring the joining members 2 themselves from aluminum, which is a metal material the same as that of the housing 3 and base 4, copper, or the like.

Here, one example will be shown about a process of manufacturing the cooler 1. First, the housing 3 and the base 4 are molded by casting and extrusion, respectively. Next, mounting of the semiconductor elements 11 and the like onto the base 4, connection of the piping portion 13 to the housing 3, and disposition of the double O-rings 14 are carried out. Next, the joining members 2 are fixed in the joining surface portion 7 of the housing 3, the base 4 is super imposed thereon, and the base 4 is pressed against the housing 3 side, thereby press fitting the cylindrical portions 2c of the joining members 2 into the base 4 and carrying out rivet fixing. Next, the outer peripheral portion of the base 4 is fixed to the housing 3 by the screws 12. It is thereby possible to obtain the configuration of the power conversion device 100 in FIG. 1.

According to the cooler 1 of the present application, it is possible to realize a configuration which can achieve an increase in the output power of and a reduction in the size of the power conversion device 100, and while maintaining high cooling performance, combines therewith mechanical strength corresponding to an in-vehicle environment in which an external force, such as vibration or impact, acts. Furthermore, as the joining members 2 are different members from the screws 12, mechanical joining methods can be differently used in press fitting the joining members 2 and screw fastening the screws 12, and the base 4 can be formed of a material having elongatability suitable for press fitting, so that it is possible to reduce manufacturing costs. Also, one side of each of the joining members 2 is screw fastened into the housing 3, and the base 4 is pressed fitted with the joining members 2, thereby enabling an easy assembly, so that it is possible to reduce assembling costs.

Although the disclosure is described above in terms of an exemplary embodiment, it should be understood that the various features, aspects and functionality described in the embodiment are not limited in their applicability to the particular embodiment, with which they are described, but instead can be applied, alone or in various combinations to the embodiment of the disclosure. It is therefore understood that numerous modifications which have not been exemplified can be devised without departing from the scope of the present disclosure. For example, at least one of the constituent components may be modified, added, or eliminated.

What is claimed is:
1. A cooler, comprising:
a base;
semiconductor elements mounted on an upper surface of the base;
a housing superimposed on a rear surface side of the base, the rear surface side being towards a first direction, wherein a refrigerant flow path is formed between the housing and the base;
fastening members disposed in an outer peripheral portion of an overlap region between the base and the housing and which fasten and fix the base to the housing;
sealing members which seal an outer peripheral portion of the refrigerant flow path; and
joining members disposed in a joining surface portion of the housing, the joining surface portion inside the outer peripheral portion of the refrigerant flow path and contacts the base,
wherein a first end of each of the joining members, in a second direction opposite to the first direction, bites into the base in an unpenetrated state such that an end-most surface of each of the joining members, in the second direction, faces a respective internal surface of the base that faces in the first direction, and
wherein a second end of each of the joining members, in the first direction, bites into the housing in an unpenetrated state such that an end-most surface of each of the joining members, in the first direction, faces a respective internal surface of the housing that faces in the second direction.

2. The cooler according to claim 1, wherein
the refrigerant flow path is configured of a groove portion formed in an upper surface of the housing, and
the joining surface portion is a part of the upper surface of the housing and joined to the rear surface of the base, and the joining surface portion is surrounded by the groove portion.

3. The cooler according to claim 1, wherein
the joining surface portion is disposed in a central portion of the overlap region of the base and housing.

4. The cooler according to claim 1, wherein each joining member from among the joining members comprises:
- a cylindrical portion that is the first end of the joining member, and that bites into the base; and
- a screw fastening portion that is the second end of the joining member, and that is fastened into a respective screw hole provided in the housing,
- wherein a leading end portion of the cylindrical portion is of an outwardly spreading form.

5. The cooler according to claim 4, wherein
- the joining members each have, between the screw fastening portion and the cylindrical portion, an engaging portion that is configured to engage with a fastening jig to be used when fastening the screw fastening portion into the housing.

6. The cooler according to claim 1, wherein
- the base, the housing, and the joining members are configured from the same metal.

7. The cooler according to claim 1, wherein
- the cooler is applied to an in-vehicle power conversion device.

8. The cooler according to claim 1, wherein the end-most surface of each of the joining members, in the second direction, contacts the respective internal surface of the base that faces in the first direction, and
- the end-most surface of each of the joining members, in the first direction, contacts the respective internal surface of the housing that faces in the second direction.

* * * * *